(12) United States Patent
Huang et al.

(10) Patent No.: US 9,473,292 B2
(45) Date of Patent: Oct. 18, 2016

(54) DEVICE AND METHOD FOR NRZ CDR CALIBRATION

(75) Inventors: Liang-Wei Huang, HsinChu (TW); Mei-Chao Yeh, HsinChu (TW); Ting-Fa Yu, HsinChu (TW); Ta-Chin Tseng, HsinChu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 787 days.

(21) Appl. No.: 13/162,822

(22) Filed: Jun. 17, 2011

(65) Prior Publication Data

US 2011/0311010 A1  Dec. 22, 2011

(30) Foreign Application Priority Data

Jun. 18, 2010 (TW) .............................. 99119963 A (51) Int. Cl.
| | |
|---|---|
| *H04L 7/08* | (2006.01) |
| *H04L 7/033* | (2006.01) |
| *H03L 7/08* | (2006.01) |
| *H03L 7/091* | (2006.01) |
| *H03L 7/093* | (2006.01) |

(52) U.S. Cl.
CPC ............. *H04L 7/033* (2013.01); *H03L 7/0807* (2013.01); *H03L 7/091* (2013.01); *H03L 7/093* (2013.01)

(58) Field of Classification Search
USPC ................ 375/371, 233, 287, 340, 373, 316
See application file for complete search history.

(56) References Cited

U.S. PATENT DOCUMENTS

| | | | |
|---|---|---|---|
| 8,306,175 B2* | 11/2012 | Lee et al. ....................... | 375/373 |
| 2003/0156662 A1* | 8/2003 | Engl et al. .................... | 375/340 |
| 2004/0141567 A1* | 7/2004 | Yang et al. .................... | 375/287 |
| 2006/0115035 A1* | 6/2006 | Yu et al. ........................ | 375/376 |
| 2007/0280343 A1* | 12/2007 | Bau et al. ...................... | 375/233 |
| 2008/0031385 A1* | 2/2008 | Aung et al. ................... | 375/316 |
| 2009/0296867 A1* | 12/2009 | Do et al. ........................ | 375/371 |
| 2011/0286511 A1* | 11/2011 | Zeng et al. .................... | 375/233 |

* cited by examiner

*Primary Examiner* — Jaison Joseph
(74) *Attorney, Agent, or Firm* — McClure, Qualey & Rodack, LLP (57) ABSTRACT

The disclosure is a device and a method for Non Return to Zero (NRZ) Clock Data Recovery (CDR) calibration, which includes a CDR unit and a weight calculator unit. The CDR unit receives a compensative signal of an equalization filter to generate an error signal, a sampling clock signal, a transition sampling signal and a data signal. The weight calculator unit receives the error signal, the transition sampling signal and the data signal, and then uses a run length technique to generate weight data. The weight data controls a voltage control oscillator (VCO) which calibrates the phase and the frequency of the sampling clock signal.

10 Claims, 6 Drawing Sheets

DEVICE AND METHOD FOR NRZ CDR CALIBRATION

CROSS-REFERENCES TO RELATED APPLICATIONS

This non-provisional application claims priority under 35 U.S.C. §119(a) on Patent Application No. 99119963 filed in Taiwan, R.O.C. on Jun. 18, 2010, the entire contents of which are hereby incorporated by reference.

BACKGROUND OF THE INVENTION

1. Technical Field

The disclosure relates to a receiver device, and more particularly to a device and a method for Non Return to Zero (NRZ) Clock Data Recovery (CDR) calibration.

2. Related Art

Figure 1:
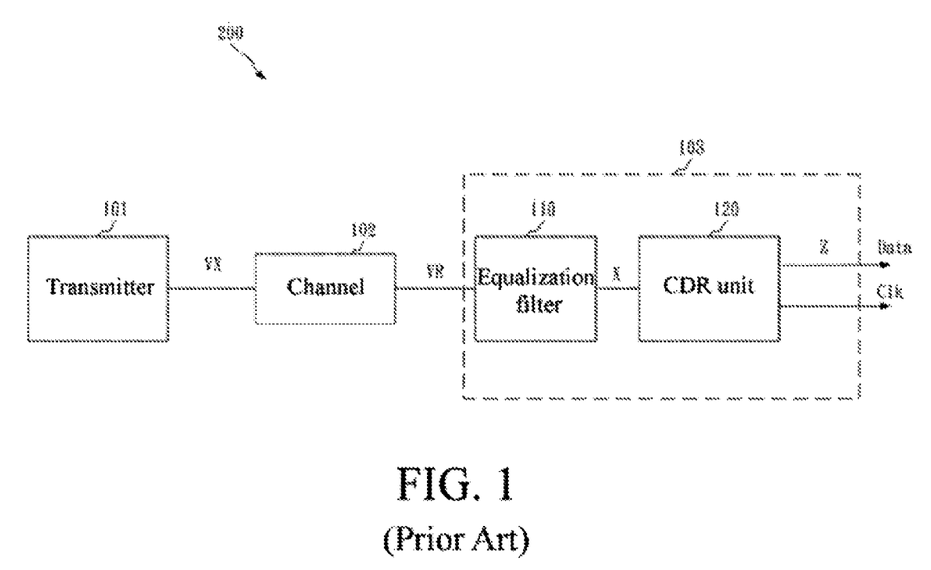
FIG. 1 is a functional block diagram of a communication system.

FIG. 1 shows the architecture of an ordinary communication system, which includes a transmitter 101, a channel 102 and a receiver equalizer 103. The receiver equalizer 103 includes an equalization filter 110 and a CDR unit 120. The equalization filter 110 is used for receiving a channel signal VX and compensating the channel signal VX to obtain a compensative signal X, and the CDR unit 120 is used for receiving the compensative signal X and outputting a data signal Z and a sampling clock signal CLK.

If the CDR unit 120 in the prior art adjusts the sampling clock signal CLK without considering data dependence during data transition, a correct CLK may be adjusted to be an incorrect CLK, and the CLK adjustment may be slowed down. Moreover, when the channel signal VR suffers serious interference, the equalization filter 110 cannot fully compensate the channel signal VR, so that the compensative signal X is incomplete, and if the CDR unit 120 receives the incomplete compensative signal X, serious offset or loss-of-lock occurs to the phase and the frequency of the CLK of the CDR unit 120. At this time, when the equalization filter 110 receives the normal channel signal VR and generates the compensative signal X, the CDR unit 120 in the prior art still repeatedly uses the phase and the frequency of the offset CLK to sample the compensative signal X and obtain sampling data, and a logic operation unit in the CDR unit 120 uses the sampling data for operation to gradually obtain the phase and the frequency of the normal CLK step by step, but cannot quickly adjust the CLK. When the circuit in the CDR unit 120 causes serious offset or loss-of-lock of the CLK due to noise interference, the CDR unit in the prior art cannot quickly calibrate or adjust the phase and the frequency of the CLK even if the CDR unit returns to normal condition.

SUMMARY

The disclosure provides a device for NRZ CDR calibration, which uses a run length technique for weight calculation, so as to solve the problems of the prior art.

An objective of the disclosure is to provide a device for NRZ CDR calibration, which includes a CDR unit and a weight calculator unit. The CDR unit is coupled to an equalization filter, and used for receiving a compensative signal to generate a sampling clock signal, a data signal, an error signal and a transition sampling signal. The weight calculator unit is coupled to the CDR unit, and used for receiving the error signal and the data signal and then performing weight calculation to generate weight data. The CDR unit adjusts the sampling clock signal according to the weight data.

Another objective of the disclosure is to provide a method for NRZ CDR calibration, which includes: receiving a compensative signal to generate a sampling clock signal, a data signal, an error signal and a transition sampling signal; performing weight calculation according to the error signal, the transition sampling signal and the data signal to generate weight data; and adjusting the sampling clock signal according to the weight data.

In order to make the aforementioned and other objectives, features and advantages of the disclosure comprehensible, preferred embodiments accompanied with figures are described in detail below.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 2:
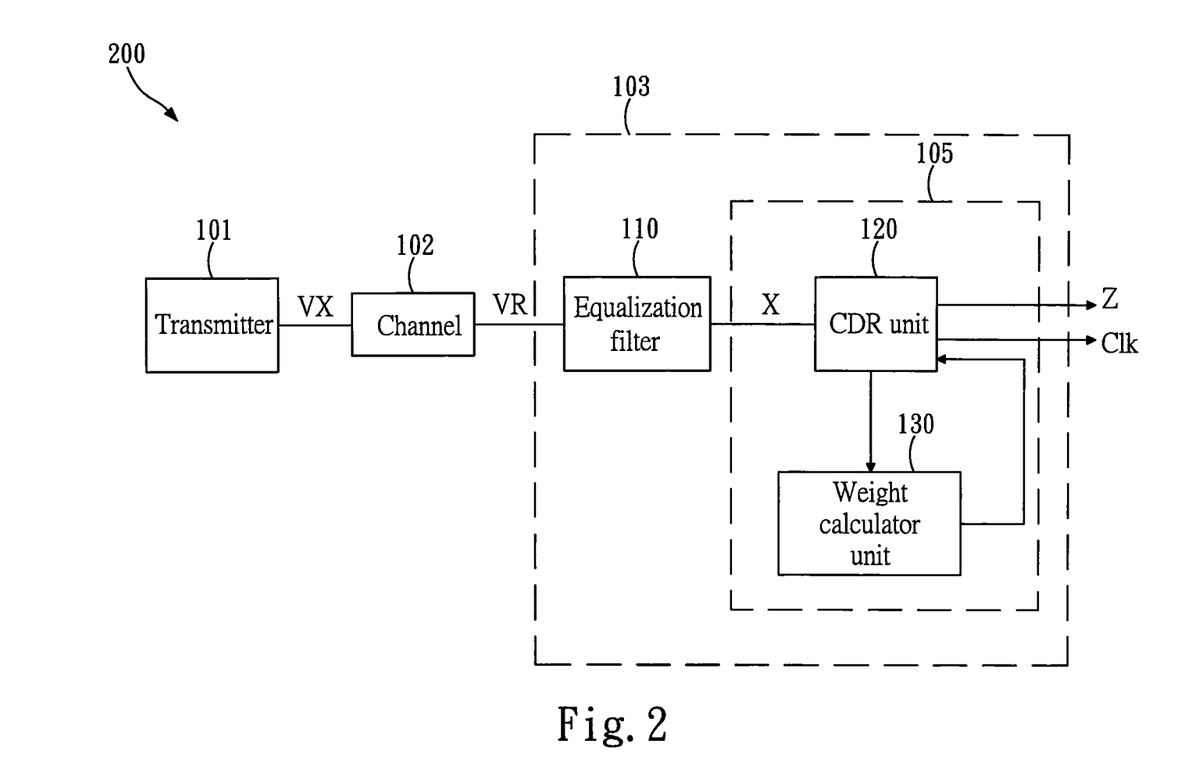
FIG. 2 is a functional block diagram of a device for NRZ CDR calibration of a communication system.

FIG. 2 is a functional block diagram of a device for NRZ CDR calibration of a communication system of the disclosure. Please refer to FIG. 2, in which the device for NRZ CDR calibration 105 of the communication system 200 includes a CDR unit 120 and a weight calculator unit 130. A transmitter 101 transfers a transmission signal VX, which becomes a channel signal VR after passing through a channel 102. The channel signal VR is compensated by the equalization filter 110 into a compensative signal X. The CDR unit 120 is coupled to the equalization filter 110, and used for processing the compensative signal X to generate an error signal E, a sampling clock signal CLK, a transition sampling signal S and a data signal Z. The weight calculator unit 130 is coupled to the CDR unit 120, and used for receiving the error signal E and the data signal Z (embodiment of FIG. 3), or receiving the transition sampling signal S, the error signal E and the data signal Z (embodiment of FIG. 4), using a run length technique to perform weight calculation to generate weight data "we", and adjusting the phase and the frequency of the CLK according to the weight data "we".

The disclosure provides the weight calculator unit 130 to use the run length technique to alleviate the problems of the prior art. For example, a binary sequence of the compensative signal X is 1111011111, and here an end portion 011111 of the sequence is used for the purpose of description; it is defined for the purpose of run length operation that the first code data is a and second code data is b, and if [a b] represents lengths of run length (run length values), of a number of successive low-order binary bits and a number of successive high-order binary bits before and after data transition, the run lengths are respectively [1 5]. In practice, it is found that the larger an absolute value of a minus "b" (abs(a−b)) is, if the CDR unit 120 has already generated desirable phase and frequency of the CLK, the less likely is the necessity for the CDR unit 120 to adjust the phase and the frequency of the CLK. When "a" is equal to "b" (a=b) (that is, the received successive binary sequence is 01010101, 001100110011, 000111000111 or 0000111100001111), due to desirable distinguishability (that is, signals 1 and 0 have relatively symmetrical waveforms), adjustment can be performed quickly according to the current sequence bits to obtain the phase and the frequency of a good CLK. If 000111 is taken as an example, "a" is equal to 3, "b" is equal to 3, the absolute value of a minus "b" is 0 (abs(3−3)=0), and a desirable phase and frequency of the CLK can be easily obtained by using the result to adjust the phase and the frequency of the CLK.

Two embodiments of the device for NRZ CDR calibration are described below.

Figure 3:
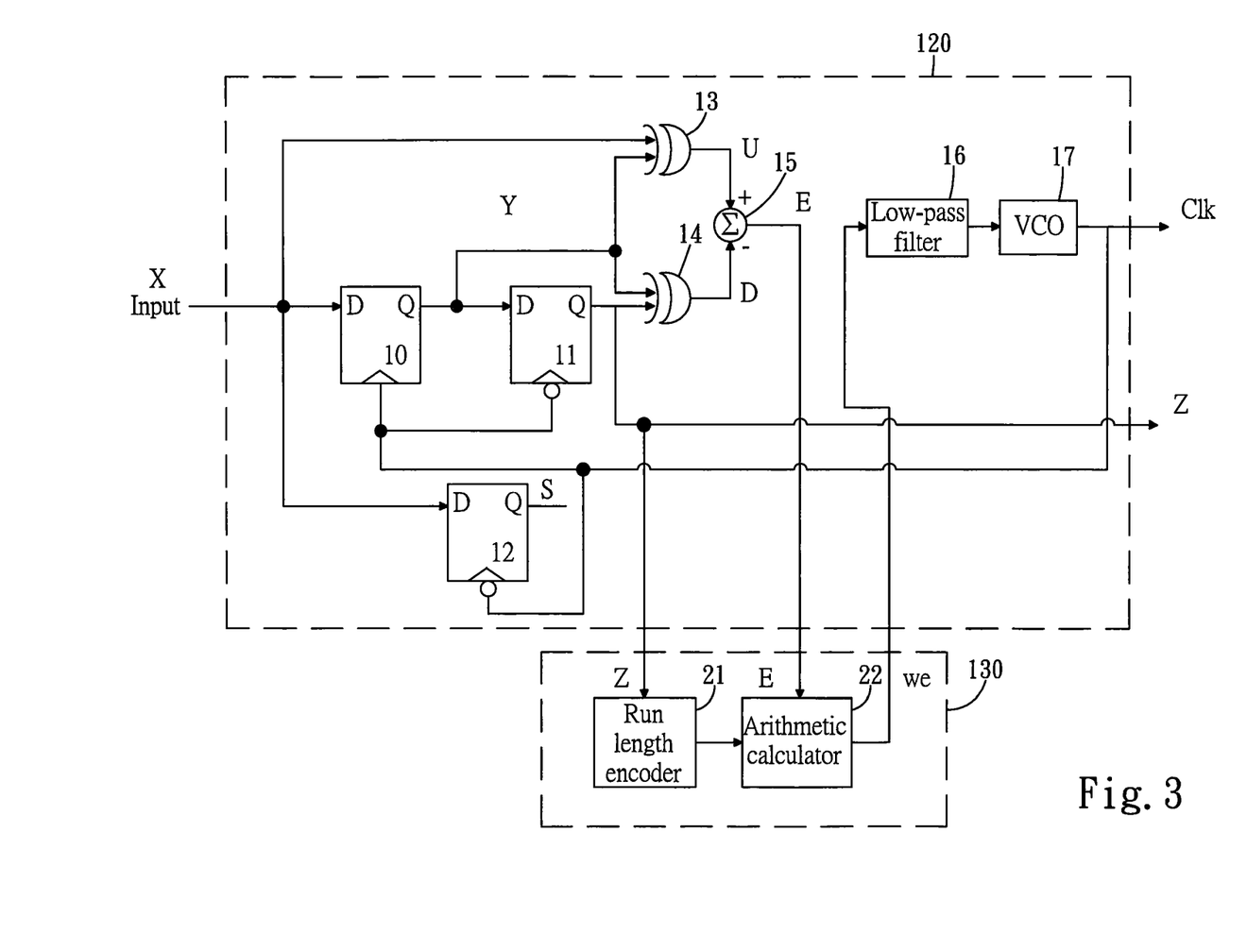
FIG. 3 is a first embodiment of a weight calculator unit of a device for NRZ CDR calibration.

FIG. 3 shows a first embodiment of the weight calculator unit 130 of the device for NRZ CDR calibration 105 of the disclosure. The weight calculator unit 130 of the device for NRZ CDR calibration 105 includes a run length encoder 21 and an arithmetic calculator 22. The CDR unit 120 is coupled to the equalization filter 110, and used for receiving a compensative signal X and operating on sampling data of the compensative signal X according to a CLK to generate an error signal E, a transition sampling signal S, a data signal Z and the CLK. The run length encoder 21 is coupled to the CDR unit 120, and used for encoding the data signal Z into first code data a and second code data b. The arithmetic calculator 22 is coupled to the run length encoder 21, and used for receiving the error signal E, the first code data a and the second code data b, and performing arithmetic calculation to generate weight data we to the CDR unit 120. The compensative signal X is sampled at a rising edge of the CLK to generate a signal Y, and the signal Y is sampled at a falling edge of the CLK to generate the data signal Z. An exclusive OR gate 13 receives the compensative signal X and the signal Y to generate a signal U, an exclusive OR gate 14 receives the signal Y and the data signal Z to generate a signal D, and an adder 15 subtracts the signal D from the signal U to provide the error signal E.

Example 1

It is assumed that the data signal Z (00001111) is input to the run length encoder 21, and the run length encoder 21 uses the run length technique to encode the data signal to generate a being 4 and "b" being 4. At this time, an operational formula of the arithmetic calculator 22 is:

$$we = (max\_run\_length - abs(a-b)) * E \quad \text{Formula 1}$$

The maximum run length (max_run_length) is a preset run length value, and may be preset to be 5, and accordingly, it is calculated according to Formula 1. (we=(5−abs(4−4))*E) that the weight data we=5E, with a weight of 5. The weight data we=5E is sent to the CDR unit 120, and the weight data we=5E will be output to a low-pass filter 16 to filter out high frequency noises and control a voltage control oscillator (VCO) 17. It can be seen from Formula 1 that when "a" is equal to b, the weight data "we" is 5E, indicating that the binary sequence 00001111 of the data signal Z contains desirable weight data we. By using the desirable weight data we to control the VCO 17, the VCO 17 of the CDR unit 120 can be quickly adjusted to correct phase and frequency of the CLK.

Example 2

It is assumed that the data signal Z (011111) is input to the run length encoder 21, and the run length encoder 21 encodes the data signal Z to generate a being 1 and "b" being 5. The arithmetic calculator 22 obtains through calculations in accordance with to Formula 1 that the weight data "we"=(5−abs(1−5))*E, that is, the weight data "we"=1E, with a weight of 1. The weight data "we"=1E is sent to the CDR unit 120, and the weight data "we"=1E is firstly output to a low-pass filter 16 to filter out high frequency noises and control a VCO 17. It can be seen from Formula 1 that when "a" is 1 and "b" is 5, the weight data "we" is 1E, indicating that the binary sequence 011111 of the data signal Z does not contain a desirable weight data "we". The weight data "we" can only slightly adjust the VCO 17, and in practice, the VCO 17 may not need to be adjusted as long as the absolute value of the first code data a minus the second code data "b" is too large, so as to prevent serious offset of the phase and the frequency of the CLK due to over-adjustment.

Figure 4:
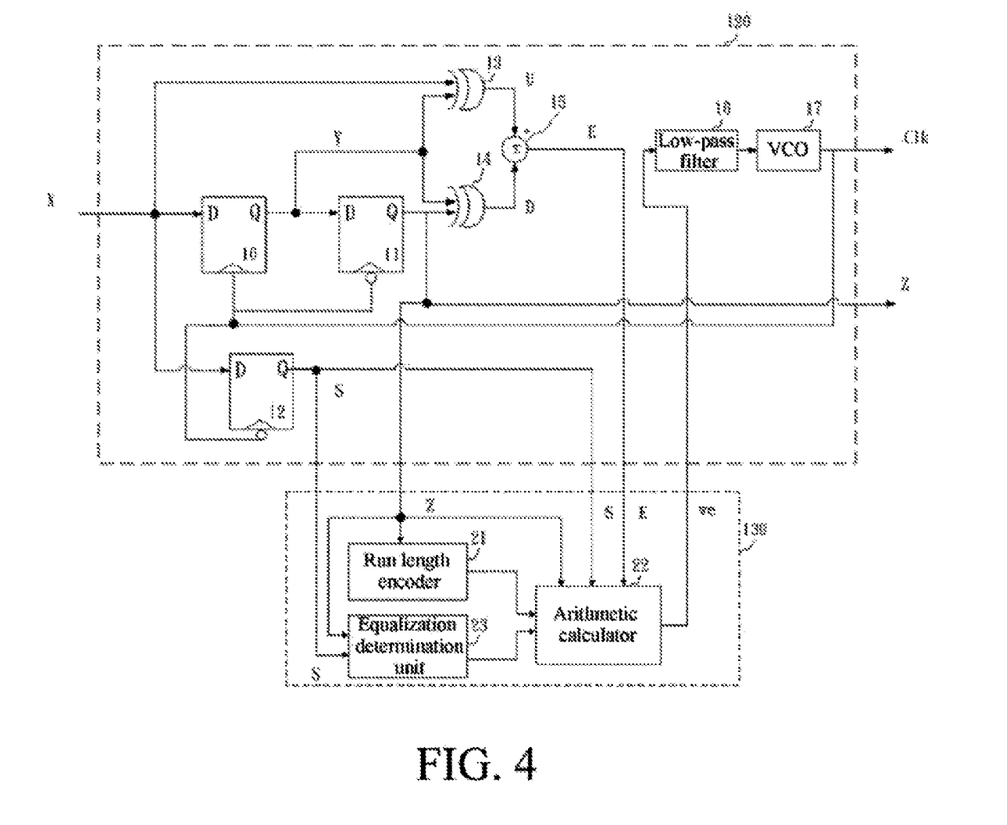
FIG. 4 is a second embodiment of a weight calculator unit of a device for NRZ CDR calibration.

Next, FIG. 4 shows a second embodiment of the weight calculator unit 130 of the device for NRZ CDR calibration 105 of the disclosure. The difference between the second embodiment of the weight calculator unit 120 of FIG. 4 and the first embodiment of FIG. 3 lies in that, in the second embodiment, an equalization determination unit 23 is provided to assist the weight calculator unit 130 to determine the state of the CLK of the CDR unit 120. The weight calculator unit 130 of the device for NRZ CDR calibration 105 includes a run length encoder 21, an equalization determination unit 23 and an arithmetic calculator 22. The CDR unit 120 is coupled to the equalization filter 110, and used for receiving a compensative signal X to generate an error signal E, a transition sampling signal S, a data signal Z and a CLK. The run length encoder 21 is coupled to the CDR unit 120, and used for encoding the data signal Z into first code data a and second code data b. The equalization determination unit 23 is coupled to the CDR unit 120, and used for determining whether channel attenuation is over-compensated (over EQ), or under-compensated (under EQ) according to the transition sampling signal S and the data signal Z, so as to generate an equalization determination result. The arithmetic calculator 22 is coupled to the run length encoder 21 and the equalization determination unit 23, and used for receiving the error signal E, the equalization determination result, the transition sampling signal S, the data signal Z, the first code data a and the second code data b, and performing arithmetic calculation to generate weight data "we" and outputting the weight data "we" to the CDR unit 120.

The equalization determination unit 23 may be a digital accumulator, for accumulating a plurality of transition sampling signals S and data signals Z and determining whether the current situation is over EQ or under EQ, so as to generate an equalization determination result. When the equalization determination result is first equalization data, it indicates over EQ, and when the equalization determination result is second equalization data, it indicates under EQ. Generally, the equalization determination unit 23 is used for accumulating more than tens or hundreds of transition sampling signals S and data signals Z, and determining whether the compensative signal X obtained by the equalization filter 110 compensating the currently received channel signal VX is over EQ or under EQ.

Figure 5:
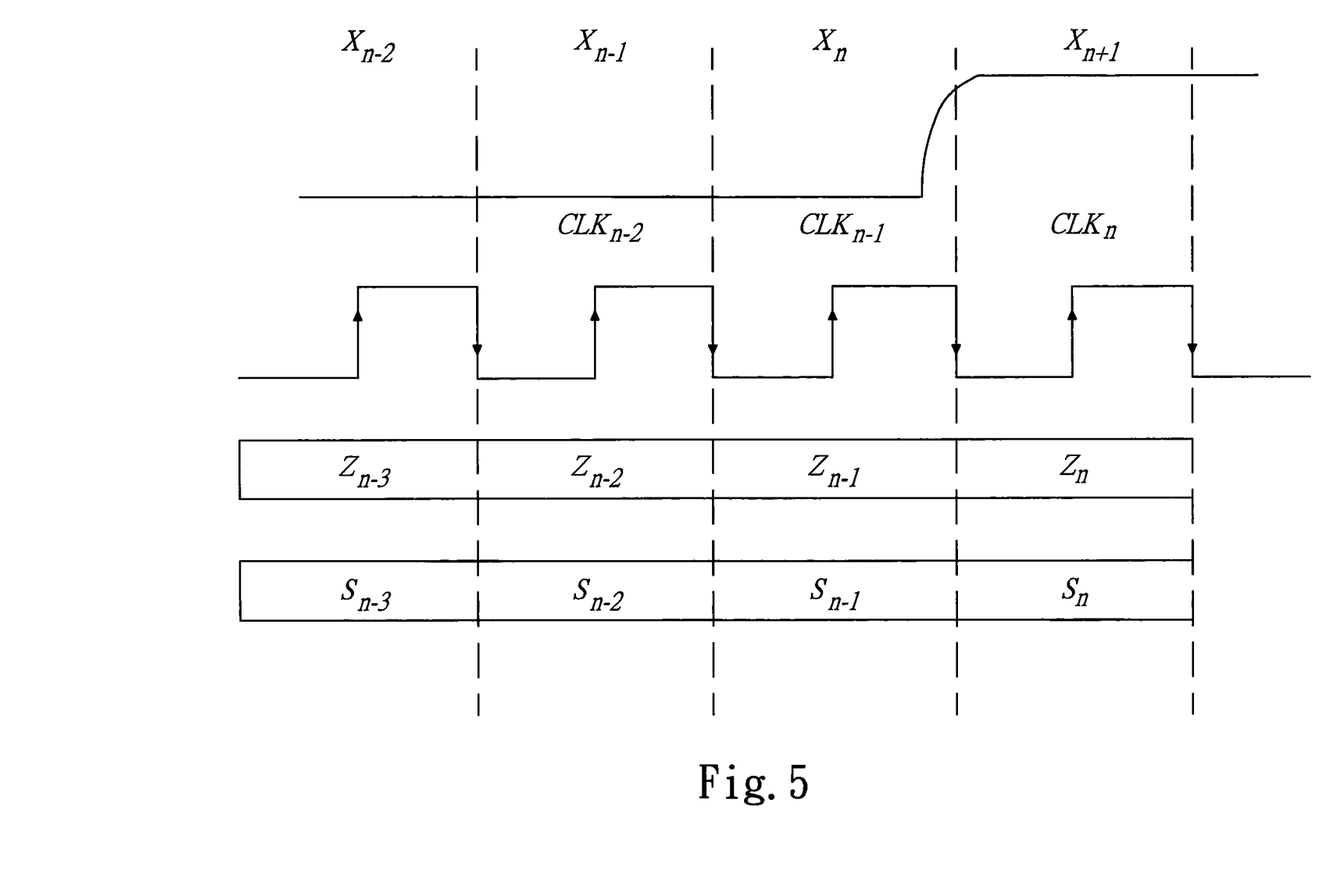
FIG. 5 is a timing chart of a data signal and a transition sampling signal.

Next, FIG. 5 is a timing chart of the data signal Z and the transition sampling signal S. If the input of the CDR unit 120 is a compensative signal $X_n$, the output is a sampling clock signal $CLK_n$, a transition sampling signal $S_n$ and a data signal $Z_n$. The transition sampling signal $S_n$ is a signal obtained by sampling the compensative signal $X_n$ at a negative edge of the sampling clock signal $CLK_{n-1}$, and $S_{n-1}$, represents a signal obtained by sampling the compensative signal $X_{n-1}$ at a negative edge of the sampling clock signal $CLK_{n-2}$. At this time, the data signal $Z_n$ is a signal obtained by sampling the compensative signal $X_n$ at a positive edge of the clock signal $CLK_{n-1}$, and sampling again at a negative edge of the sampling clock signal $CLK_{n-1}$ and $Z_{n-1}$, represents a signal obtained by sampling the compensative signal $X_{n-1}$ at a positive edge of the sampling clock signal $CLK_{n-2}$ and sampling again at a negative edge of the sampling clock signal $CLK_{n-2}$.

When the CLK of the CDR unit 120 is in a desirable state or the CLK is already at a desirable sampling point, a method for determining Under EQ is as follows: if a minus "b" is larger than 0 and $S_{n-1}$, is equal to $Z_{n-1}$, or the first code data a minus the second code data "b" is smaller than 0 and $S_{n-1}$, is equal to $Z_n$, that is, $\{[(a-b>0)\ \&\ (S_{n-1}=Z_{n-1})]\text{or}[(a-b<0)\ \&\ (S_{n-1}=Z_n)]\}$, the compensative signal X is Under EQ; and a method for determining Over EQ is as follows: if a minus "b" is smaller than 0 and $S_{n-1}$ is equal to $Z_{n-1}$, or a minus "b" is larger than 0 and $S_{n-1}$ is equal to $Z_n$, that is, $\{[(a-b<0)\ \&\ (S_{n-1}=Z_{n-1})]\text{or}[(a-b>0)\ \&\ (S_{n-1}=Z_n)]\}$, the compensative signal X is Over EQ.

If the equalization determination unit 23 determines that the current situation is Under EQ (the second equalization data in the equalization determination result), under the above condition for determining Over EQ, or the equalization determination unit 23 determines that the current situation is Over EQ (the first equalization data in the equalization determination result), under the above condition for determining Under EQ, it indicates that at this time the CLK of the CDR unit 120 is not in a desirable state, but is in a serious error or loss-of-lock state, and requires immediate high-weight adjustment. The operation is as follows: the arithmetic calculator 22 performs operations related to the above condition for determining Over EQ or Under EQ according to the first code data a, the second code data b, the first equalization data, the second equalization data, the transition sampling signal S and the data signal Z, and compares with the determination result of the equalization determination unit 23, so as to determine whether the current CLK of the CDR unit 120 is in a desirable state or in a serious error or loss-of-lock state; and if the CDR unit is in a serious error state, high-weight calibration needs to be performed. The following are the related formulas and conditions.

If (the first equalization data is true & $\{[(a-b>0)\ \&\ (S_{n-1}=Z_{n-1})]\text{or}[(a-b<0)\ \&\ (S_{n-1}=Z_n)]\}$ is true)    Condition 2 calibration=max_run_length

"we"=max(max_run_length–abs($a-b$),calibration)*E    Formula 2 else if (the second equalization data is true & $\{[(a-b<0)\ \&\ (S_{n-1}=Z_{n-1})]\text{or}[(a-b>0)\ \&\ (S_{n-1}=Z_n)]\}$ is true)    Condition 3 calibration=max_run_length

"we"=max(max_run_length–abs($a-b$),calibration)*E    Formula 3 else    Condition 4 calibration=0

"we"=max(max_run_length–abs($a-b$),calibration)*E    Formula 4

It can be seen from these related formulas and conditions that the second embodiment of the disclosure, under the condition of Formula 1 of the first embodiment, further provides a determination method when the CLK of the CDR unit 120 is not in a desirable state (in a serious error or loss-of-lock state), and a corresponding quick calibration mechanism.

Example 1

It is assumed that the data signal Z having a binary sequence of 0110011111100 is input to the run length encoder 21, in which the number of successive 0 bits after the 4$^{th}$ bit is 2, that is, the first code data "a" is 2, and the number of successive 1 bits after the 6$^{th}$ bit is 5, that is, the second code data "b" is 5, and the maximum run length (max_run_length), is set to 5. Condition 2 is true, that is, the first equalization data is true and the condition for determining Under EQ is true, indicating that the arithmetic calculator 22 determines that channel attenuation is under-compensated; however, the determination result of the equalization determination unit 23 according to previous data is that channel attenuation is over-compensated. Therefore, if Condition 2 is satisfied, it indicates that serious offset occurs to the phase and the frequency of the current CLK of the CDR unit 120, and in this case, a maximum calibration needs to be used for quick adjustment and recovery, and at this time, the calibration is 5. At this time, Formula 2 becomes max(5–abs(2–5),5)*E, indicating that the absolute value of the first code data a being 2 minus the second code data "b" being 5 is 3, the result of the maximum run length (max_run_length), being 5 minus 3 is 2, the result being 5 is compared with the calibration being 5, and a maximum of the two is taken. Therefore, the arithmetic calculator 22 obtains that the weight data "we" is 5E, with a weight of 5, and then sends the weight data "we" being 5E to the CDR unit 120 to quickly adjust the VCO 17, so as to adjust the CLK, thereby obtaining desirable phase and frequency.

Example 2

It is assumed that the data signal Z having a binary sequence of 0110011111100 is input to the run length encoder 21, in which "a" is 2, "b" is 5, and max_run_length is set to be 5. Condition 4 in the arithmetic calculator 22 is satisfied (indicating that neither Condition 2 nor Condition 3 is satisfied). At this time calibration=0, and accordingly Formula 4 becomes max(5−abs(2−5),0)*E, so the arithmetic calculator 22 obtains that the weight data "we" is 2E, with a weight of 2, and then sends the weight data "we" being 2E to the CDR unit 120 to adjust the phase and the frequency of the CLK. The weight data "we" being 2E indicates that desirable phase and frequency of the CLK can be obtained simply by slightly adjusting the VCO 17.

Example 3

It is assumed that the data signal Z having a binary sequence of 0110000111100 is input to the run length encoder 21, in which "a" is 4, "b" is 4, and max_run_length is set to be 5. Condition 4 in the arithmetic calculator 22 is satisfied (indicating that neither of Condition 2 and Condition 3 is satisfied). At this time calibration=0, and accordingly Formula 4 becomes max(5−abs(4−4),0)*E, so the arithmetic calculator 22 obtains that the weight data "we" is 5E, with a weight of 5, and then sends the weight data "we" being 5E to the CDR unit 120. The weight data "we" being 5E indicates that the compensative signal X has desirable distinguishability, and the CDR unit 120 can operate by using the compensative signal X, and use the result of operation to enable the VCO 17 to quickly adjust the phase and the frequency of the CLK. Therefore, the phase and the frequency of the CLK can be quickly adjusted as long as a successive binary sequence (01010101, 001100110011, 000111000111, or 0000111100001111) is received.

It should be noted that parameters and values of the above formulas and conditions are not particularly limited, and the selection of the parameters and the setting of the values may vary with practical applications of the system.

Figure 6:
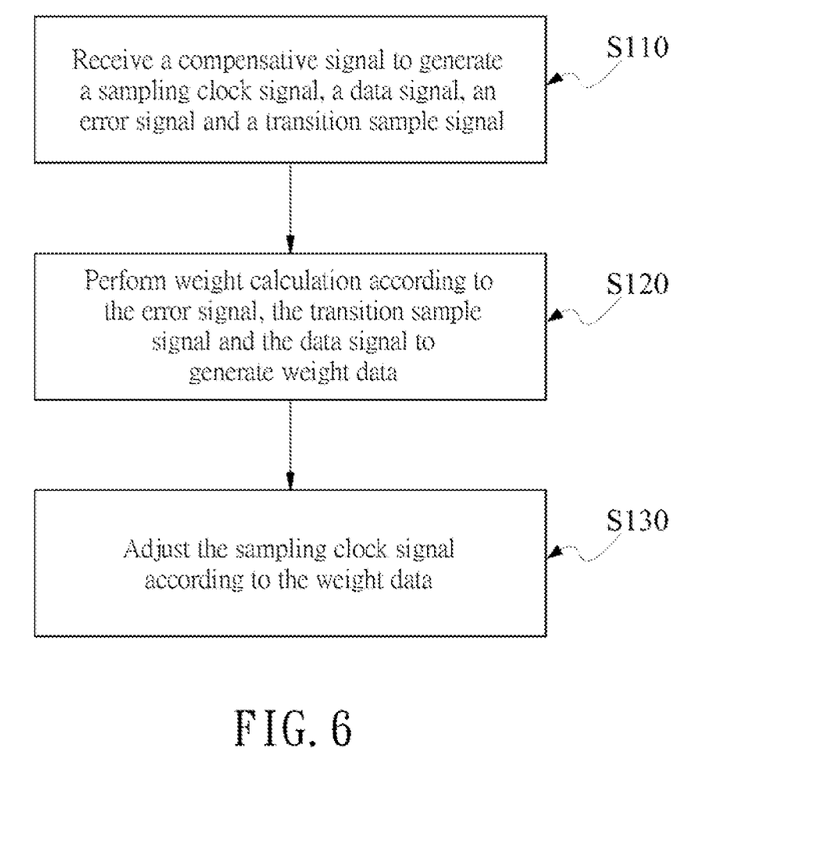
FIG. 6 is a flow chart of a method for NRZ CDR calibration.

Next, FIG. 6 is a flow chart of a method for NRZ CDR calibration of the disclosure, which includes the following steps.

In Step S110, a compensative signal is received to generate a sampling clock signal, a data signal, an error signal and a transition sampling signal.

In Step S120, weight calculation is performed according to the error signal, the transition sampling signal and the data signal to generate weight data.

In Step S130, the sampling clock signal is adjusted according to the weight data.

The transition sampling signal is obtained by sampling the compensative signal at a negative edge of the sampling clock signal, and the data signal is obtained by sampling the compensative signal at a positive edge of the sampling clock signal and sampling again at the negative edge of the sampling clock signal. The step of performing the weight calculation includes using a run length technique to encode the data signal to generate first code data and second code data, in which the first code data is a number of successive low-order binary bits and the second code data is a number of successive high-order binary bits, or the first code data is a number of successive high-order binary bits and the second code data is a number of successive low-order binary bits.

While the present invention has been described by the way of example and in terms of the preferred embodiments, it is to be understood that the invention need not to be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A device for Non Return to Zero (NRZ) Clock Data Recovery (CDR) calibration, comprising:
   a CDR unit, for receiving a compensative signal to generate a sampling clock signal, a data signal, an error signal and a transition sampling signal, the error signal being output from the CDR unit; and
   a weight calculator unit, separate and distinct from the CDR unit, coupled to the CDR unit, and configured to receive the error signal and the data signal and then performing weight calculation to generate a weight data;
   wherein the CDR unit adjusts the sampling clock signal according to the weight data.

2. The device for NRZ CDR calibration according to claim 1, wherein the weight calculator unit comprises: a run length encoder, coupled to the CDR unit, for encoding the data signal into a first code data and a second code data, wherein the first code data is a number of successive low-order binary bits, and the second code data is a number of successive high-order binary bits; and an arithmetic calculator, coupled to the run length encoder and the CDR unit, for receiving the error signal, the first code data and the second code data, and performing arithmetic calculation to generate the weight data.

3. The device for NRZ CDR calibration according to claim 2, wherein the arithmetic calculator generates a weight of the weight data according to an absolute value of a difference between the first code data and the second code data.

4. The device for NRZ CDR calibration according to claim 3, wherein the larger the absolute value of the difference between the first code data and the second code data is, the smaller the weight is.

5. The device for NRZ CDR calibration according to claim 3, wherein the arithmetic calculator generates the weight according to a run length value minus the absolute value of the difference between the first code data and the second code data.

6. The device for NRZ CDR calibration according to claim 1, wherein the weight calculator unit receives the error signal, the transition sampling signal and the data signal and then performs the weight calculation to generate the weight data, and the weight calculator unit comprises: a run length encoder, coupled to the CDR unit, for encoding the data signal into a first code data and a second code data, wherein the first code data is a number of successive low-order binary bits, and the second code data is a number of successive high-order binary bits; an equalization determination unit, coupled to the CDR unit, for determining whether channel attenuation is over-compensated or under-compensated according to the transition sampling signal and the data signal, so as to generate an equalization determination result; and an arithmetic calculator, coupled to the run length encoder, for receiving the error signal, the equalization determination result, the transition sampling signal, the data signal, the first code data and the second code data, and performing arithmetic calculation to, generate the weight data.

7. The device for NRZ CDR calibration according to claim 6, wherein the equalization determination unit is a digital accumulator, for accumulating the transition sampling signal and the data signal to generate the equalization determination result.

8. The device for NRZ CDR calibration according to claim 6, wherein the arithmetic calculator generates a weight of the weight data according to an absolute value of a difference between the first code data and the second code data.

9. The device for NRZ CDR calibration according to claim 6, wherein the arithmetic calculator generates an equalization condition determination result according to the transition sampling signal, the data signal, the first code data and the second code data, compares the equalization condition determination result with the equalization determination result to generate a determination result, and generates a weight of the weight data according to the determination result and an absolute value of a difference between the first code data and the second code data.

10. The device for NRZ CDR calibration according to claim 6, wherein the arithmetic calculator compares a run length value minus an absolute value of a difference between the first code data and the second code data with a calibration data, and uses the larger one of the two to generate a weight of the weight data.

* * * * *